(12) United States Patent
Forbes et al.

(10) Patent No.: US 6,307,405 B2
(45) Date of Patent: *Oct. 23, 2001

(54) CURRENT SENSE AMPLIFIER AND CURRENT COMPARATOR WITH HYSTERESIS

(75) Inventors: Leonard Forbes, Corvallis, OR (US); Eugene H. Cloud, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,099

(22) Filed: Apr. 27, 1999

(51) Int. Cl.[7] .............................. G11C 7/06; H03K 3/356
(52) U.S. Cl. ............................. 327/54; 327/87; 327/20; 365/208
(58) Field of Search ................................. 327/51, 52, 53, 327/54, 56, 77, 87, 205, 206; 365/207, 208; 330/253, 260

(56) References Cited

U.S. PATENT DOCUMENTS

| | | | |
|---|---|---|---|
| 4,503,340 | 3/1985 | Linder | 327/72 |
| 4,616,148 | * 10/1986 | Ochii et al. | 327/55 |
| 5,132,576 | 7/1992 | Park | 327/51 |
| 5,309,047 | 5/1994 | Tiede et al. | 327/52 |
| 5,390,147 | 2/1995 | Smarandoiu et al. | 365/185.21 |
| 5,438,287 | * 8/1995 | Faue | 327/54 |
| 5,446,396 | * 8/1995 | Brehmer | 327/66 |
| 5,612,630 | 3/1997 | Wright et al. | 326/22 |
| 5,687,123 | 11/1997 | Hidaka et al. | 365/189.09 |
| 5,691,658 | * 11/1997 | Klein | 327/104 |
| 5,789,981 | 8/1998 | Singer et al. | 330/253 |
| 5,793,230 | 8/1998 | Chu et al. | 327/77 |
| 5,804,994 | 9/1998 | Marlow et al. | 327/67 |
| 5,808,496 | 9/1998 | Thiel | 327/210 |
| 5,841,718 | * 11/1998 | Watters et al. | 365/208 |
| 5,850,365 | 12/1998 | Reese et al. | 365/207 |
| 6,008,673 | * 12/1999 | Glass et al. | 327/77 |
| 6,081,140 | 6/2000 | King | 327/77 |

FOREIGN PATENT DOCUMENTS

| | | | |
|---|---|---|---|
| 0397355 | 11/1990 | (EP) | G11C/7/06 |
| 0594305 | 4/1994 | (EP) | H03K/3/353 |
| 0681293 | 11/1995 | (EP) | G11C/7/00 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits, 27 (4)*, pp. 618–624, (Apr. 1992).

(List continued on next page.)

*Primary Examiner*—Timothy P. Callahan
*Assistant Examiner*—Terry L. Englund
(74) *Attorney, Agent, or Firm*—Schwegman, Lundberg, Woessner & Kluth, P.A.

(57) ABSTRACT

Current sense amplifiers with hysteresis are provided which conserve scarce chip surface area yet still provide fast response times in a low power CMOS environment. A first embodiment includes a first amplifier and a second amplifier which are electrically coupled. Each amplifier includes a first transistor of a first conductivity type and a second transistor of a second conductivity type, where the first and second transistors are coupled at a drain region. A signal input node is coupled to a source region of the first transistor in each amplifier. A signal output node is coupled to the drain region of the first and the second transistors in the second amplifier. The signal output node is further coupled to a gate of a third transistor in order to introduce hysteresis into the current sense amplifier. Integrated circuits, electrical systems, methods of operation and methods of forming the novel current sense amplifier are similarly included.

44 Claims, 8 Drawing Sheets

OTHER PUBLICATIONS

Campbell, J., "MOS Differential Comparators with Internal Hysteresis", *Motorola Technical Developments, vol. 8*, pp. 77–79, (Oct. 1988).

Ishibashi, K., et al., "A 6-ns 4-Mb CMOS SRAM with Offset-Voltage-Insensitive Current Sense Amplifiers", *IEEE Journal of Solid-State Circuits, 30 (4)*, pp. 480–486, (1995).

Lahiji, G.R., et al., "High-speed current-mode sense amplifier", *Electronic Letters, 30 (17)*, pp. 1371–1372, (Aug. 1994).

Sedra, A.S., et al., *Microelectronic Circuits, 3rd Edition*, Saunders College Publishing, pp. 864–867, (1991).

Seevinck, E., et al., "Current-Mode Techniques for High--Speed VLSI Circuits with Application to Current Sense Amplifier for CMOS SRAM's", *IEEE Journal of Solid State Circuits, 26 (4)*, pp. 525–535, (Apr. 1991).

Shibata, N., "Current Sense Amplifiers for Low-Voltage Memories", *IEICE Trans. Electron., E79-C (8)*, pp. 1120–1130, (Aug. 1996).

* cited by examiner

CURRENT SENSE AMPLIFIER AND CURRENT COMPARATOR WITH HYSTERESIS

FIELD OF THE INVENTION

The present invention relates generally to integrated circuits. More particularly, it pertains to structures and methods for current sense amplifiers and current comparators with hysteresis.

BACKGROUND OF THE INVENTION

Figure 1A:
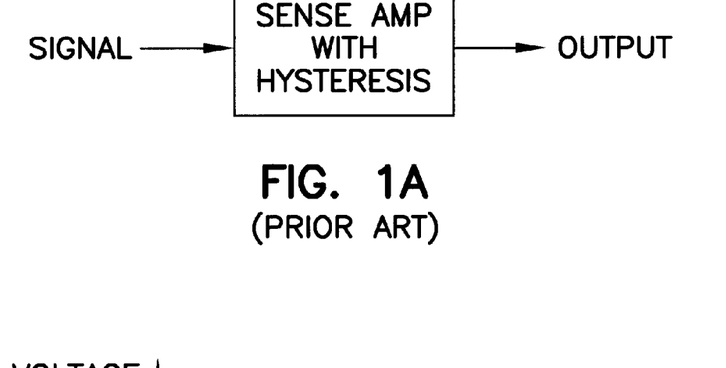
FIGS. 1A, 1B, and 1C provide a prior art representation of high and low trip points for a voltage sense amplifier with hysteresis.
Figure 1B:
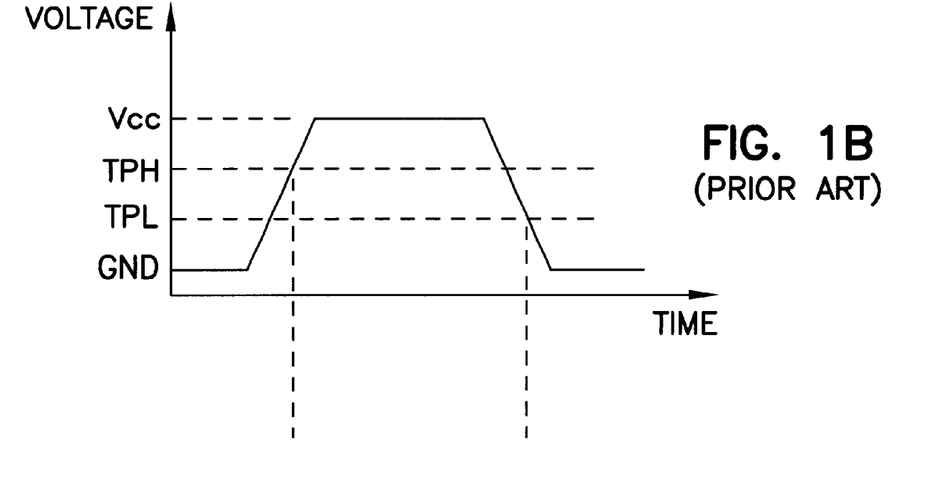
Figure 1C:
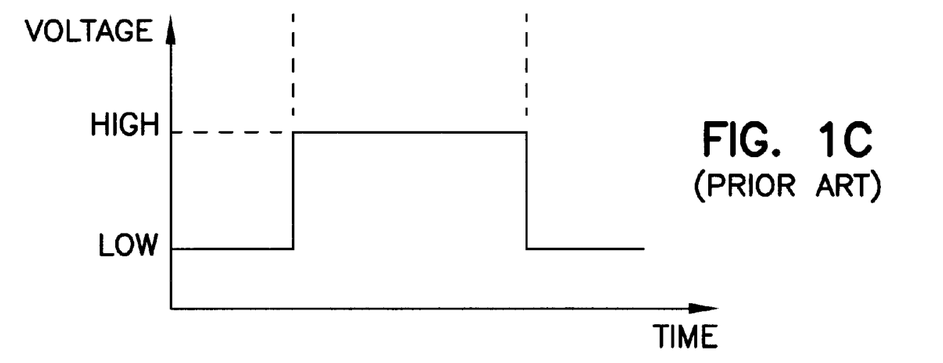

The use of voltage sense amplifiers with hysteresis for noise rejection is known. The simplest voltage sense amplifier is an operational amplifier in a positive feedback configuration. In the case of voltage hysteresis two different trip points (Tph and Tpl) are defined and circuits are designed such that when a high signal is to be recognized it must exhibit a voltage higher than Tph before it is recognized and declared a high signal. In a similar manner, before a low signal is recognized it must exhibit a low voltage lower than the second trip point Tpl. A simple illustration of this is provided in FIGS. 1A, 1B, and 1C.

In the quest for higher speed signaling it has recently been proposed to use current mode interconnections rather than voltage mode. The goal is to provide impedance matching on signal interconnection lines to reduce or avoid reflections and ringing on the lines. The technique proposed is matching termination of the signal line(s) to the signal receiver by using current mode interconnections and current mode sense amplifiers or current mode comparators. Signal interconnection and clock distribution lines with low controlled impedances are most amenable to current mode signaling. Metal lines separated from metal ground planes or metal power supply distribution planes (which are at AC ground) by oxide or other integrated circuit insulators will have low characteristic impedances of the order 50 or 75 ohms. To avoid reflections and ringing these need to be terminated in their characteristic impedance which requires sense amplifiers or receivers with low input impedances and implies small voltage swings on the lines. This is most easily accomplished by using current sense amplifiers which normally have a low input impedance. Rather than trying to sense the small voltage swings on the lines one can instead sense the current signal. Both single ended and differential configurations are possible. Current sense amplifiers have been described for use in SRAM's and in low impedance current-mode interconnections in CMOS integrated circuits with shielded interconnection lines. While this will reduce reflections and ringing it will not completely eliminate them. Also, this technique is still susceptible to noise transients.

For the reasons stated above, and for other reasons stated below which will become apparent to those skilled in the art upon reading and understanding the present specification, it is desirable to develop sense amplifiers or current comparators which are even less susceptible to induced noise, current reflections or ringing.

SUMMARY OF THE INVENTION

The above mentioned problems for high speed signaling as well as other problems are addressed by the present invention and will be understood by reading and studying the following specification. The present invention provides a current sense amplifier or current comparator with adjustable thresholds for the detection of valid signals coupled with the rejection of small noise current transients or reflections and ringing when using low impedance interconnections and/or current signaling. In particular, an illustrative embodiment of the present invention includes current sense amplifiers with hysteresis introduced as receivers for current mode signaling and/or clock distribution on low impedance integrated circuit interconnection lines. The introduction of hysteresis into the current sense amplifiers and/or receivers will allow them to discriminate against noise transients since the output will not change states unless the signal becomes more positive than a high trip point, Tph, or more negative than a low trip point, Tpl.

A first embodiment includes a current sense amplifier which has a first amplifier and a second amplifier. Each amplifier includes a first transistor of a first conductivity type and a second transistor of a second conductivity type, where the first and second transistors are coupled at a drain region. A signal input is coupled to a source region of the first transistor. A signal output node is coupled to the drain region of the first and the second transistor in the second amplifier. The signal output node is further coupled to a gate of a third transistor to introduce hysteresis for various values of an input current.

These and other method embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 2A:
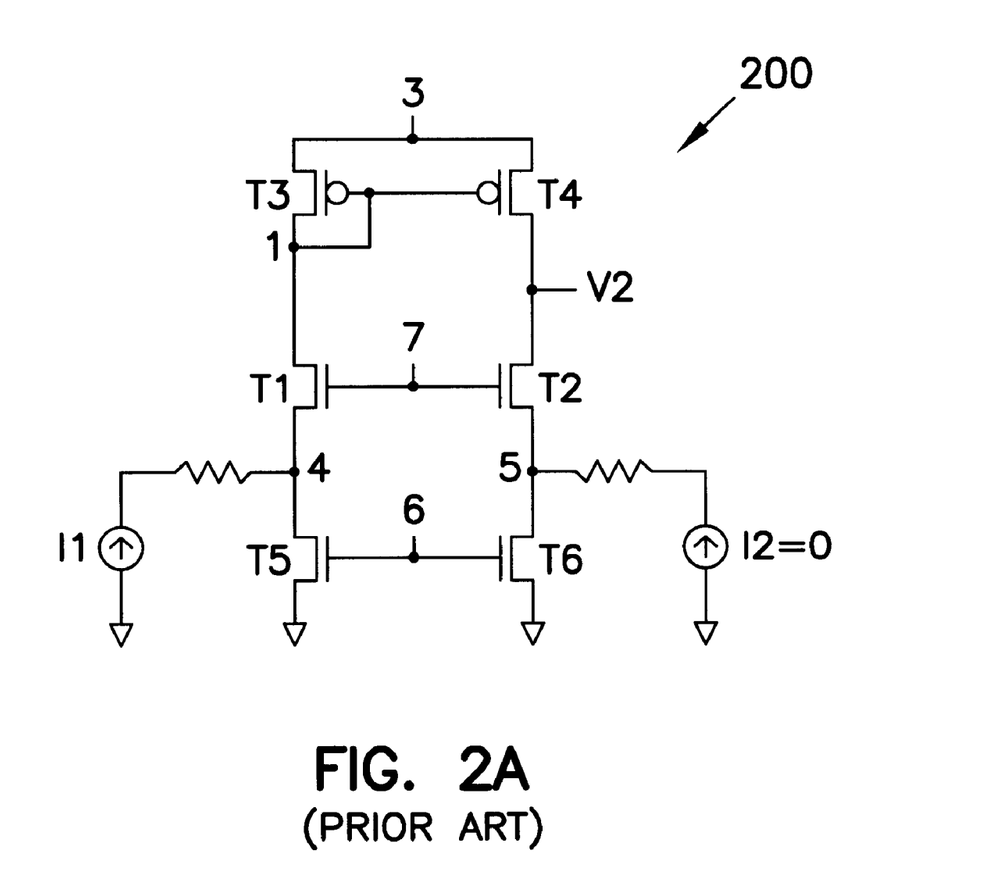
FIG. 2A is a schematic illustration of a conventional current sense amplifier.
Figure 2B:
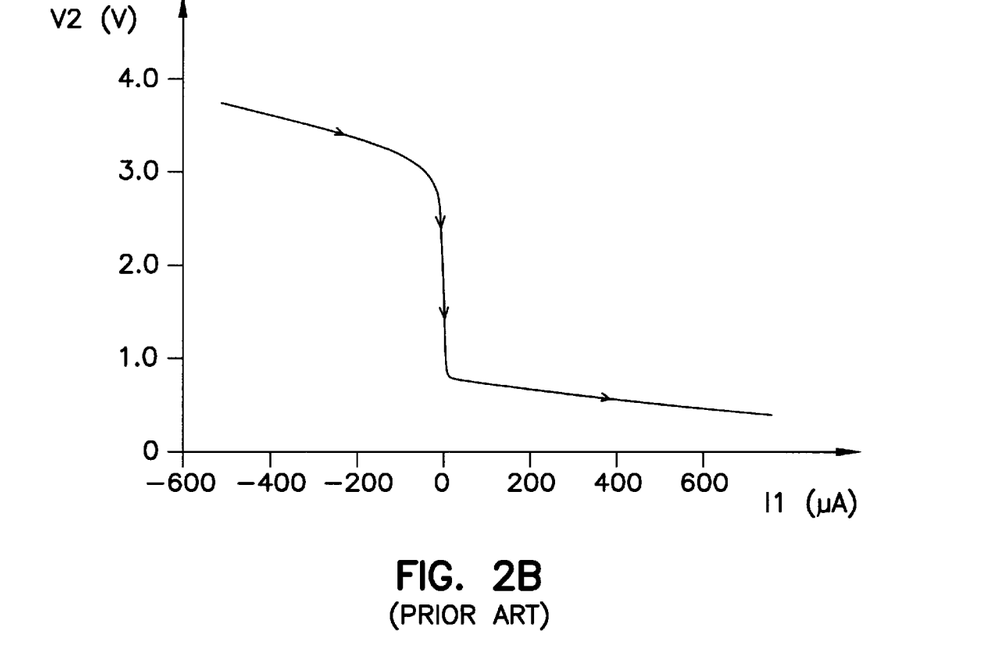
FIG. 2B is a graphical representation of the current versus voltage (I–V) curve of the conventional current sense amplifier shown in FIG. 2A.

FIG. 2A is a schematic illustration of a conventional current sense amplifier 200. In FIG. 2A, the conventional current sense amplifier 200 is shown driven with a single ended or single sided input, I1. The other differential input, I2, is held at zero amperes. The output voltage (V2) is given by $-Zv(I1-I2)$, where Zv is the transimpedance (Gain) for the conventional current sense amplifier 200. This transimpedance, Zv, is very high until the output voltage, V2, clamps at either a high level or a low level. In operation, the conventional current sense amplifier 200 wants to be symmetrically balanced. A current, I1, injected into node 4 will see a high impedance looking into transistor T5 and a lower impedance looking into transistor T1. Therefore, the injected current, I1, flows mostly into transistor T1. This will subtract, or reduce, the amount of current flowing down the left hand side of the conventional current sense amplifier 200 through transistor T3. In result, the potential at node 1 increases which places a higher potential on the gate of T4. As the gate potential of transistor T4 increases, transistors T2 and T6 operate to pull the output voltage, V2, down toward ground. FIG. 2B is a graphical representation of the current versus voltage (I–V) curve of the conventional current sense amplifier 200 shown in FIG. 2A.

Figure 2C:
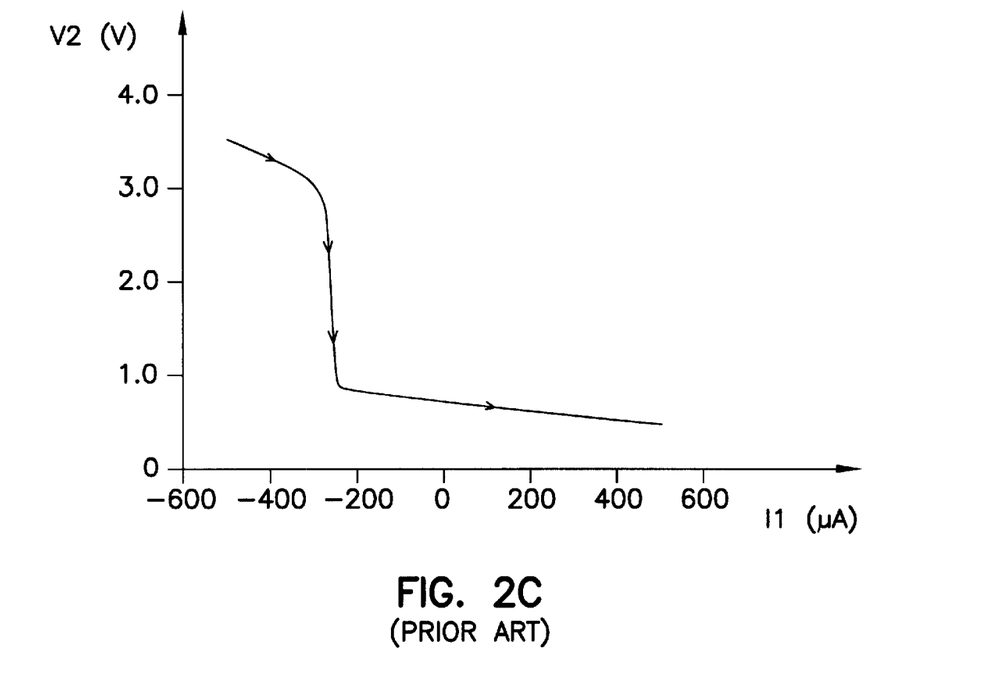
FIG. 2C is another graphical representation of the current versus voltage (I–V) curve of the conventional current sense amplifier shown in FIG. 2A.

FIG. 2C is another graphical representation of the current versus voltage (I–V) curve of the conventional current sense amplifier 200 shown in FIG. 2A. In this embodiment, the conventional current sense amplifier is driven with two inputs, or a differential signal, where I2=−250 micro Amperes ($\mu$A). Here, the output voltage, V2, changes states when I1=−250 $\mu$A, so that (I1−I2) first becomes positive and −Zv(I1−I2) goes to the most negative value.

Figure 3A:
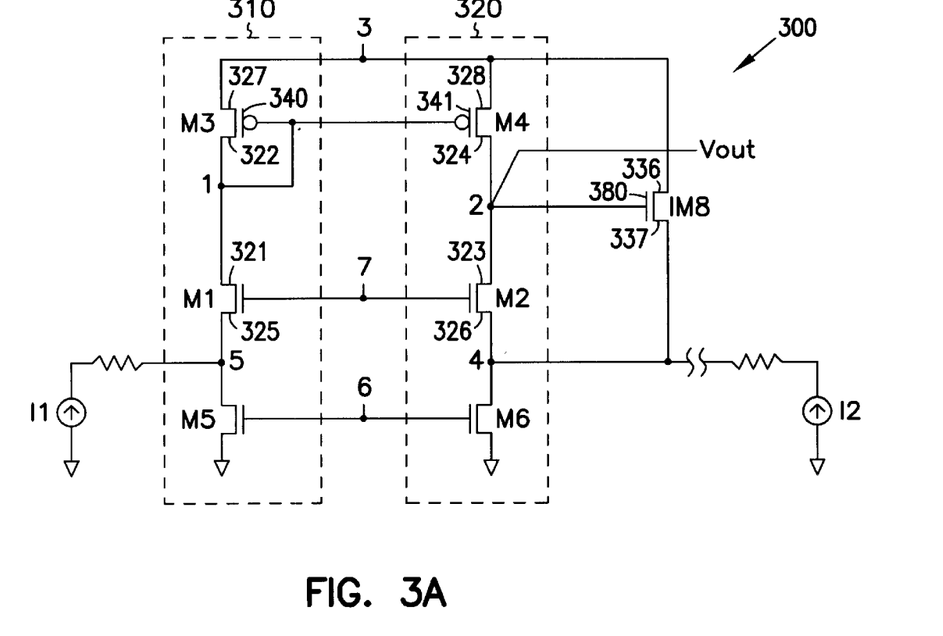
FIG. 3A is a schematic illustration of a current sense amplifier, or current comparator, according to the teachings of the present invention.

FIG. 3A is a schematic illustration of a current sense amplifier 300, or current comparator 300, according to the teachings of the present invention. As shown in FIG. 3A, the current sense amplifier 300 includes a first amplifier 310, or left side 310, and a second amplifier 320, or right side 320. Each amplifier, 310 and 320, includes a first transistor of a first conductivity type, Mr. and M2 respectively. Each amplifier, 310 and 320, includes a second transistor of a second conductivity type, M3 and M4 respectively. In one embodiment, the first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistors, M3 and M4. Transistors M1 and M2 are driven by a gate potential at node 7. Each amplifier, 310 and 320, includes a current sink, shown in FIG. 3A as transistors M5 and M6 which are driven by a gate potential at node 6. The first and second transistors, M1 and M3, of the first amplifier 310 are coupled at a drain region, 321 and 322 respectively, to node 1.

Node 1 couples the drain region, 321 and 322, for the first and the second transistor, M1 and M3, in the first amplifier 310 to gates, 340 and 341, of the second transistor, M3 and M4, in the first and the second amplifiers 310 and 320. The first and second transistors, M2 and M4, of the second amplifier 320 are coupled at a drain region, 323 and 324 respectively. In the embodiment shown in FIG. 3A, a signal output node 2 is coupled to the drain region, 323 and 324, of the first and the second transistors, M2 and M4, in the second amplifier 320. In an alternative embodiment, the signal output node 2 can be coupled to the drain region, 321 and 322, of the first and the second transistors, M1 and M3, in the first amplifier 310. As shown in FIG. 3A the signal output node is further coupled to a gate 380 of a third transistor M8. In one embodiment, the third transistor M8 is an n-channel metal oxide semiconductor (NMOS) transistor M8. Each amplifier, 310 and 320, includes a signal input node, 5 and 4 respectively, which is coupled to a source region, 325 and 326, of the first transistors, M1 and M2.

A source region, 327 and 328, for the second transistors, M3 and M4 respectively, in the first and second amplifiers, 310 and 320, is coupled to a voltage supply Vdd at node 3. In one embodiment, a drain region 336 of the third transistor M8 is coupled to a source region 328 of the second transistor M4 in the second amplifier 320. In this embodiment, a source region 337 of the third transistor M8 is coupled to the signal input node 4 of the second amplifier 320. In one embodiment, the signal input node 5 of the first amplifier 310 receives an input current, I1, and the signal input node 4 of the second amplifier 320 receives a reference current, I2.

Figure 3B:
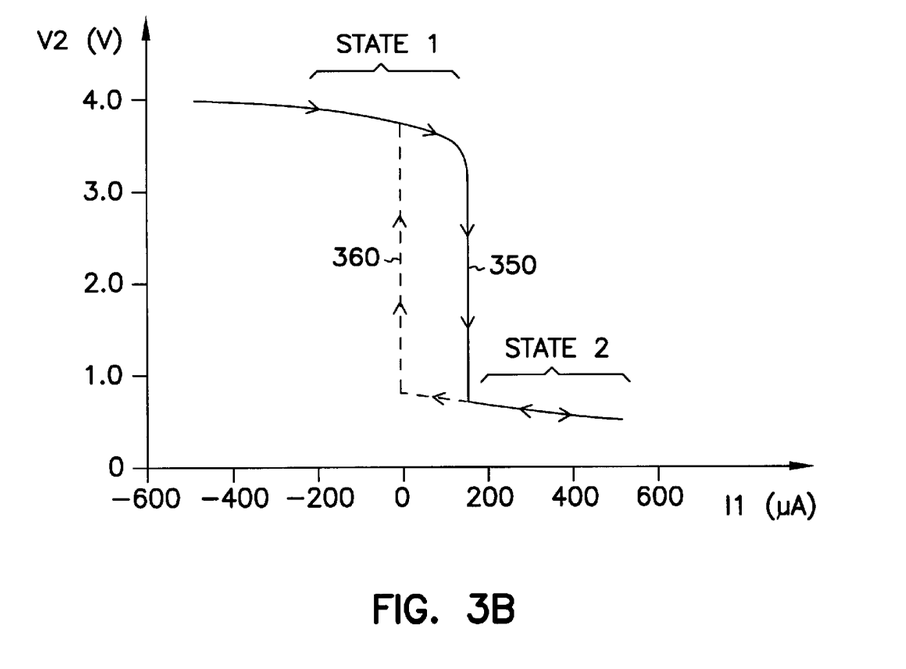
FIG. 3B is an I–V graph illustrating one embodiment of the operation of the novel current sense amplifier circuit shown in FIG. 3A.

FIG. 3B is an I–V graph illustrating one embodiment of the operation of the novel current sense amplifier circuit 300 shown in FIG. 3A. The operation of the novel current sense amplifier circuit 300 is explained by reference to FIGS. 3A and 3B. The third transistor M8 introduces a controlled hysteresis into the current sense amplifier 300 of FIG. 3A. Beginning at the left hand side of the graph, FIG. 3B illustrates the output voltage, V2, at a high state, or first state, output voltage. The high, or first state, output voltage, V2, turns on third transistor M8 which then drives an input current, IM8, into node 4. In other words, the third transistor M8 provides an input current, IM8, into node 4 which acts in conjunction with the reference current I2. The single ended input current, I1, must overcome this combination of the reference, or differential current, I2, and the input current, IM8, before the output voltage, V2, can change states. At this point, the switching action of the output voltage, V2, of the current sense amplifier 300 is given by $V2=-Zv(I1-(I2+IM8))$. The value of (I1−(I2+IM8)) must become non zero or positive for the output to switch, or go to the second state, e.g. low state. Due to the input current IM8, I1 will not "trip" the state of the current sense amplifier 300 until I1 exceeds a certain positive current value, i.e. a high trip point, shown at 350 in FIG. 3B. As one of ordinary skill in the art will understand upon reading this disclosure, the size and doping levels of the third transistor M8 can be varied to provide a set magnitude of input current, IM8, into node 4. In this manner, the circuit design of the novel current sense amplifier 300 can be manipulated to introduce a range of hysteresis for positive input current, I1, values into the current sense amplifier 300. The set hysteresis introduced, by the addition of the third transistor M8, allows the novel current sense amplifier 300 to discriminate against small transient noise values which would otherwise cause the current sense amplifier to switch states prematurely and provide an inaccurate output voltage, V2.

In reverse operation, the single ended input current, I1, is decreased from a higher positive value, e.g. above trip point value 350. As shown in FIG. 3B, while the input current, I1, is above trip point 350 the output voltage, V2, will be at a low state, or second state, output voltage. In this low, second state, the voltage potential applied to gate 380 of the third transistor M8 will not turn "on" transistor M8. Thus, the third transistor M8 is effectively removed from the current sense amplifier circuit 300. In the embodiment of FIG. 3A and 3B, node 4 will only see a reference current, I2, here held at zero amperes. In other words, the third transistor is not providing any input current, IM8, into node 4. In reverse operation, the single ended input current, I1, must again upset the balance of the current sense amplifier 300, but in the opposite direction, e.g. the input current, I1, must overcome the reference or differential current, I2, of zero amperes before the output voltage, V2, will again change states. At this point, the output voltage, V2, of the current sense amplifier 300 is given by V2=−Zv(I1−I2). In this reverse direction, (I1−I2) must become negative for the output voltage, V2, to switch back, or return to the high state, or first state, output voltage. I1 will not "trip" the state of the current sense amplifier 300 until I1 passes below a second current value, i.e. a low trip point, shown at 360 in FIG. 3B. In the embodiment shown in FIGS. 3A and 3B, the output voltage, V2, will not change states until I1 has reached zero. As one of ordinary skill in the art will understand upon reading this disclosure, the high and low trip points presented in connection with FIGS. 3A and 3B are given by way of illustration and not by way of limitation. Other high and low trip points can be achieved by varying the amount of hysteresis introduced by the third transistor M8 and/or by varying the differential/reference signal I2 of the novel current sense amplifier 300.

Figure 4A:
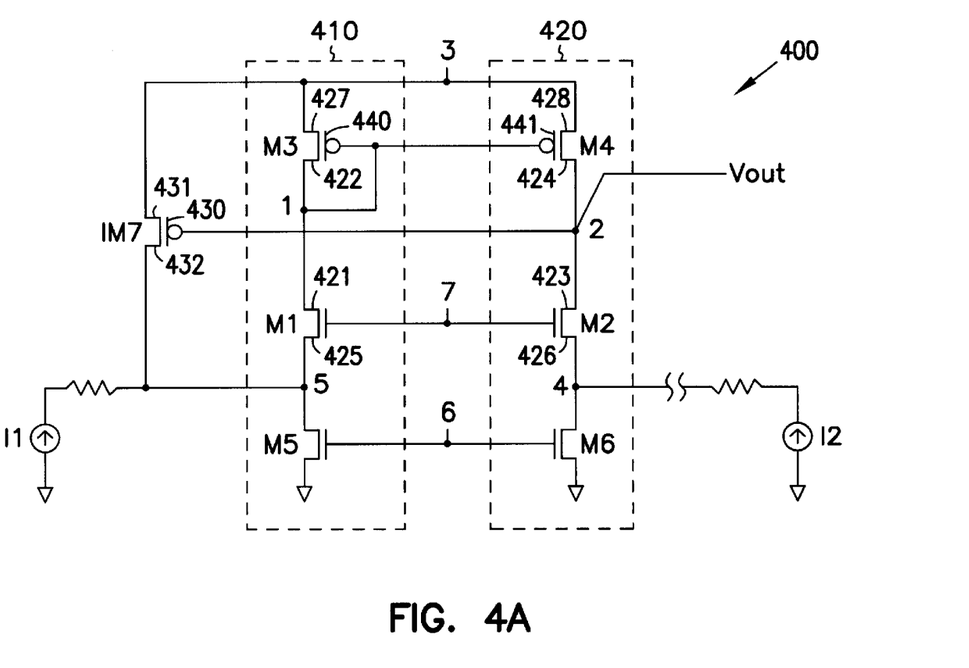
FIG. 4A is a schematic illustration of another embodiment of a current sense amplifier, or current comparator, according to the teachings of the present invention.

FIG. 4A is a schematic illustration of another embodiment of a current sense amplifier 400, or current comparator 400, according to the teachings of the present invention. As shown in FIG. 4A, the current sense amplifier 400 includes a first amplifier 410, or left side 410, and a second amplifier 420, or right side 420. Each amplifier, 410 and 420, includes a first transistor of a first conductivity type, M1 and M2 respectively. Each amplifier, 410 and 420, includes a second transistor of a second conductivity type, M3 and M4 respectively. In one embodiment, the first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistor, M3 and M4. Transistors M1 and M2 are driven by a gate potential at node 7. Each amplifier, 410 and 420, includes a current sink, shown in FIG. 4A as transistors M5 and M6 which are driven by a gate potential at node 6. The first and second transistors, M1 and M3, of the first amplifier 410 are coupled at a drain region, 421 and 422 respectively, to node 1. Node 1 couples the drain region, 421 and 422 for the first and the second transistors, M1 and M3, in the first amplifier 410 to gates, 440 and 441 of the second transistors, M3 and M4, in the first and the second amplifiers 410 and 420. The first and second transistors, M2 and M4, of the second amplifier 420 are coupled at a drain region, 423 and 424 respectively, and to a signal output node 2. Each amplifier, 410 and 420, includes a signal input node, 5 and 4 respectively, which is coupled to a source region, 425 and 426, of the first transistors, M1 and M2. In the embodiment shown in FIG. 4A, the signal output node 2 is coupled to the drain region, 423 and 424, of the first and the second transistors, M2 and M4, in the second amplifier 420. As shown in FIG. 4A the signal output node is further coupled to a gate 430 of a third transistor M7. In one embodiment, the third transistor M7 is a p-channel metal oxide semiconductor (PMOS) transistor M7.

A source region, 427 and 428, for the second transistors, M3 and M4 respectively, in the first and second amplifiers, 410 and 420, is coupled to a voltage supply Vdd at node 3. In one embodiment, a source region 431 of the third transistor M7 is coupled to a source region 427 of the second transistor M3 in the first amplifier 410. In this embodiment, a drain region 432 of the third transistor M7 is coupled to the signal input node 5 of the first amplifier 410. In one embodiment, the signal input node 5 of the first amplifier 410 receives an input current, I1, and the signal input node 4 of the second amplifier 420 receives a reference current, I2.

Figure 4B:
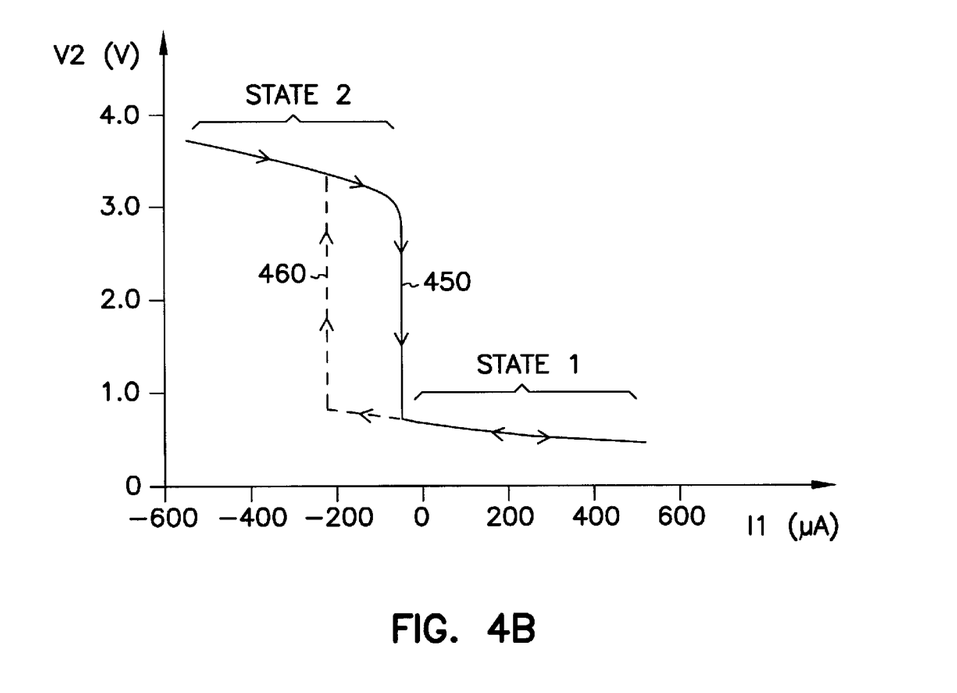
FIG. 4B is an I–V graph illustrating one embodiment of the operation of the novel current sense amplifier circuit shown in FIG. 4A.

FIG. 4B is an I–V graph illustrating one embodiment of the operation of the novel current sense amplifier circuit 400 shown in FIG. 4A. The operation of the novel current sense amplifier circuit 400 is explained by reference to FIGS. 4A and 4B. The third transistor M7 introduces a controlled hysteresis into the current sense amplifier 400 of FIG. 4A. Beginning at the right hand side of the graph, FIG. 4B illustrates the output voltage, V2, at a low state, or first state, output voltage. The low, or first state, output voltage, V2, turns on third transistor M7 which then drives a current, IM7, into node 5, the signal input node 5 for the first amplifier 410. In other words, the third transistor M7 provides an input current, IM7, into node 5. A single ended input current, I1, injected into input signal node 5 is supplemented by the input current, IM7. In order for the current sense amplifier 400 to switch the state of output voltage, V2, the current injected into the signal input node 5 must upset, or "trip" the balance of the current sense amplifier 400. In this embodiment, the signal input node 4 is held at a differential/reference signal, I2, of zero amperes. At this point, the output voltage, V2, of the current sense amplifier 400 is given by V2=−Zv((I1+IM7)−I2). Here, the value of ((I1+IM7)−I2) must become negative for the output voltage, V2, to go to a second state, or high state.

Because of the supplemented current, IM7, being driven by the third transistor M7, the input current I1 will not "trip" the state of the current sense amplifier 400 until I1 passes below a certain negative current value, i.e. a low trip point, shown at 460 in FIG. 4B. As one of ordinary skill in the art will understand upon reading this disclosure, the size and doping levels of the third transistor M7 can be varied to provide a set magnitude of input current, IM7, into node 4. In this manner, the circuit design of the novel current sense amplifier 400 can be manipulated to introduce a range of hysteresis for negative values of input current I1 into the current sense amplifier 400. The set hysteresis introduced, by the addition of the third transistor M7, allows the novel current sense amplifier 400 to discriminate against small transient noise values which would otherwise cause the current sense amplifier to switch states prematurely and provide an inaccurate output voltage, V2.

In reverse operation, the single ended input current, I1, is increased from a lower value, e.g. below trip point value 450. As shown in FIG. 4B, while the input current, I1, is below trip point 450 the output voltage, V2, will be at a high state, or second state, output voltage. In this high, second state, the voltage potential applied to gate 430 of the third transistor M7 will not turn "on" transistor M7. Thus, the third transistor M7 is effectively removed from the current sense amplifier circuit 400. In the embodiment of FIG. 4A and 4B, node 4 will see a reference current, I2, here held at zero amperes. With the third transistor M7 turned "off," the third transistor M7 is not providing any input current, IM7, into node 5. As explained above, the single ended input current, I1, must upset the balance of the current sense amplifier 400 in the opposite direction in order for the current sense amplifier 400 to switch states again, e.g. the input current, I1, must overcome the differential signal, I2, of zero amperes. At this point, the output voltage, V2, of the current sense amplifier 300 is given by V2=−Zv(I1−I2) since the third transistor M7 is removed from the current sense amplifier circuit 400.

In this reverse direction, (I1−I2) must become positive for the output voltage, V2, to switch back, or return to the low state, or first state, output voltage. I1 will not "trip" the state of the current sense amplifier 400 until I1 passes above a certain current value, i.e. a high trip point, shown at 450 in FIG. 4B. In the embodiment shown in FIGS. 4A and 4B, the output voltage, V2, will not change states until I1 has reached approximately zero Amperes. As one of ordinary skill in the art will understand upon reading this disclosure, the high and low trip points presented in connection with FIGS. 4A and 4B are given by way of illustration and not by way of limitation. Other high and low trip points can be achieved by varying the amount of hysteresis introduced by the third transistor M7 and/or by varying the differential/ reference current signal I2 of the novel current sense amplifier 400.

Figure 5A:
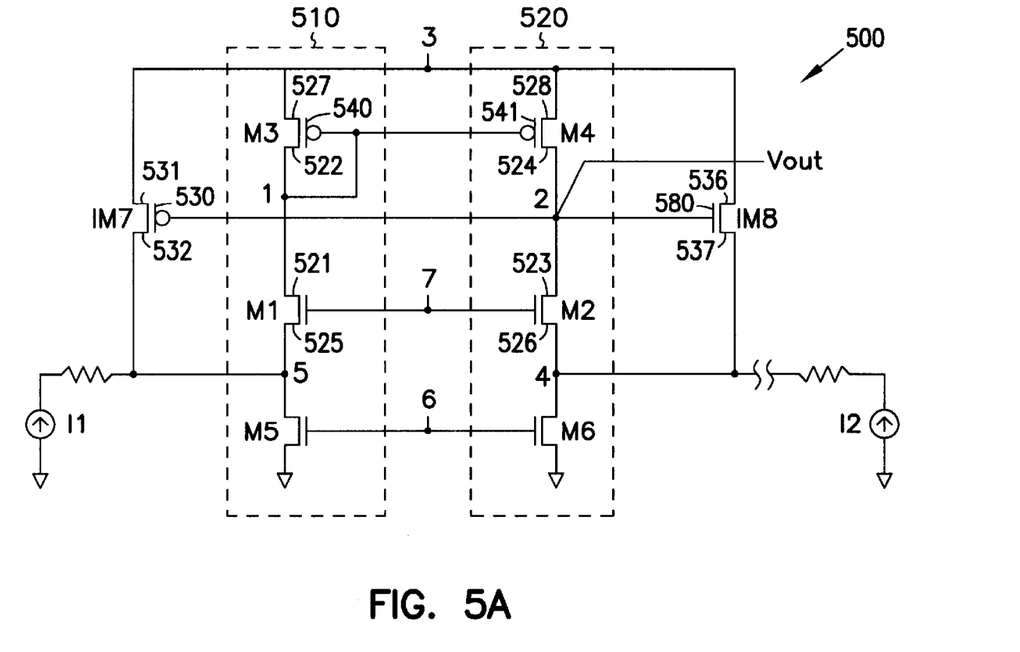
FIG. 5A is a schematic illustration of another embodiment of a current sense amplifier, current comparator, or receiver with hysteresis provided for both negative and positive values of an input current I1.

FIG. 5A is a schematic illustration of another embodiment of a current sense amplifier 500, current comparator 500, or receiver 500 with hysteresis provided for both negative and positive values of an input current I1. As shown in FIG. 5A, the current sense amplifier 500 includes a first amplifier 510, or left side 510, and a second amplifier 520, or right side 520. Each amplifier, 510 and 520, includes a first transistor of a first conductivity type, M1 and M2 respectively. Each amplifier, 510 and 520, includes a second transistor of a second conductivity type, M3 and M4 respectively. In one embodiment, the first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistor, M3 and M4. Transistors M1 and M2 are driven by a gate potential at node 7. Each amplifier, 510 and 520, includes a current sink, shown in FIG. 5A as transistors M5 and M6 which are driven by a gate potential at node 6. The first and second transistors, M1 and M3, of the first amplifier 510 are coupled at a drain region, 521 and 522 respectively, to node 1.

Node 1 couples the drain region, 521 and 522 for the first and the second transistors, M1 and M3, in the first amplifier 510 to gates, 540 and 541 of the second transistors, M3 and M4, in the first and the second amplifiers 510 and 520. The first and second transistors, M2 and M4, of the second amplifier 520 are coupled at a drain region, 523 and 524 respectively. In the embodiment shown in FIG. 5A, a signal output node 2 is coupled to the drain region, 523 and 524, of the first and the second transistors, M2 and M4, in the second amplifier 520. As shown in FIG. 5A the signal output node is further coupled to a gate 530 of a third transistor M7. In one embodiment, the third transistor M7 is a p-channel metal oxide semiconductor (PMOS) transistor M7. Each amplifier, 510 and 520, also includes a signal input node, 5 and 4 respectively, which is coupled to a source region, 525 and 526, of the first transistors, M1 and M2.

A source region, 527 and 528, for the second transistor, M3 and M4 respectively, in the first and second amplifiers, 510 and 520, is coupled to a voltage supply Vdd at node 3. In one embodiment, a source region 531 of the third transistor M7 is coupled to a source region 527 of the second transistor M3 in the first amplifier 510. In this embodiment, a drain region 532 of the third transistor M7 is coupled to the signal input node 5 of the first amplifier 510. As shown in FIG. 5A, signal input node 5 of the first amplifier 510 receives an input current, I1, and the signal input node 4 of the second amplifier 520 receives a reference, or differential current signal, I2.

As shown in FIG. 5A the signal output node 2 is further coupled to a gate 580 of a fourth transistor M8. In one embodiment, the fourth transistor M8 is an n-channel metal oxide semiconductor (NMOS) transistor M8. In one embodiment, a drain region 536 of the fourth transistor M8 is coupled to a source region 528 of the second transistor M4 in the second amplifier 520. In this embodiment, a source region 537 of the fourth transistor M8 is coupled to the signal input node 4 of the second amplifier 520.

Figure 5B:
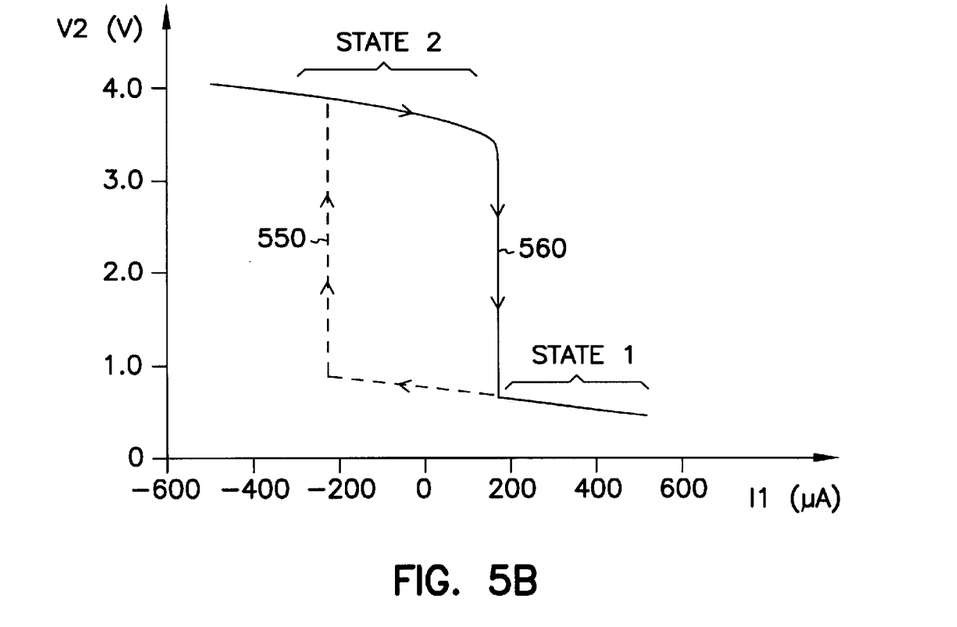
FIG. 5B is an I–V graph illustrating one embodiment of the operation of the novel current sense amplifier circuit shown in FIG. 5A.

FIG. 5B is an I–V graph illustrating one embodiment of the operation of the novel current sense amplifier circuit 500 shown in FIG. 5A. The operation of the novel current sense amplifier circuit 500 is explained by reference to FIGS. 5A and 5B. The third transistor M7 and the fourth transistor M8 introduce a controlled hysteresis into the current sense amplifier 500 of FIG. 5A. Beginning at the right hand side of the graph, FIG. 5B illustrates the output voltage, V2, at a low state, or first state, output voltage. The low, or first state, output voltage, V2, turns on third transistor M7 which then drives a current, IM7, into node 5, the signal input node 5 for the first amplifier 510. In other words, the third transistor M7 provides an input current, IM7, into node 5. A single ended input current, I1, injected into input signal node 5 is supplemented by the input current, IM7. In order for the current sense amplifier 500 to switch the state of output voltage, V2, the current injected into the signal input node 5 must upset, or "trip" the balance point of the current sense amplifier 500. The signal input node 4 is held at a reference, or differential, current signal, I2, here zero amperes. At this point, the output voltage, V2, of the current sense amplifier 500 is given by V2=−Zv((I1+IM7)−I2). The value of ((I1+IM7)−I2) must become negative for the output voltage, V2, to go to a second state, or high state. Because of the supplemented current, IM7, being driven by the third transistor M7, the input current, I1, will not "trip" the state of the current sense amplifier 500 until I1 passes below a certain negative current value, i.e. a low trip point, shown at 550 in FIG. 3B.

As one of ordinary skill in the art will understood upon reading this disclosure, the size and doping levels of the third transistor M7 can be varied to provide a set magnitude of input current, IM7, into node 5. In this manner, the circuit design of the novel current sense amplifier 500 can be manipulated to introduce a range of hysteresis for negative values of input current I1 into the current sense amplifier 500. The set hysteresis introduced, by the addition of the third transistor M7, allows the novel current sense amplifier 500 to discriminate against small transient noise values which would otherwise cause the current sense amplifier to switch states prematurely and provide an inaccurate output voltage, V2.

In reverse operation, the fourth transistor M8 acts to introduce a controlled hysteresis into the current sense amplifier 500 of FIG. 5A. Begining at the left hand side of the graph, FIG. 5B illustrates the output voltage, V2, at a high state, or second state, output voltage. The high, or second state, output voltage, V2, turns on fourth transistor M8 which then drives an input current, IM8, into node 4. In other words, the fourth transistor M8 provides an input current, IM8, into node 4 which acts in conjunction with the reference current signal I2. The single ended input current, I1, must overcome this combination of reference current signal, I2, and input current IM8 before the output voltage, V2, can change states. At this point, the output voltage, V2, of the current sense amplifier 500 is given by V2=−Zv(I1−(I2+IM8)). The value of(I1−(I2+IM8)) must reach a positive sum for the output voltage, V2, to switch or return to the low state, or first state, output voltage. Due to input current IM8, input current, I1, will not "trip" the state of the current sense amplifier 500 until I1 exceeds a certain positive current value, i.e. a high trip point, shown at 560 in FIG. 5B. As one of ordinary skill in the art will understand upon reading this disclosure, the size and doping levels of the third transistor M8 can be varied to provide a set magnitude of input current, IM8, into node 4. In this manner, the circuit design of the novel current sense amplifier 500 can be manipulated to introduce a range of hysteresis into the current sense amplifier 500 for positive input current I1 values. The set hysteresis introduced, by the addition of the third transistor M8, allows the novel current sense amplifier 500 to discriminate against small transient noise values which would otherwise cause the current sense amplifier to switch states prematurely and provide an inaccurate output voltage, V2.

As one of ordinary skill in the art will understand upon reading this disclosure, the high and low trip points presented in connection with FIGS. 5A and 5B are given by way of illustration and not by way of limitation. Other high and low trip points can be achieved by varying the amount of hysteresis introduced by third and/or fourth transistors, M7 and M8, and/or by varying the differential/reference signal I2 of the novel current sense amplifier 500. FIG. 5A and 5B illustrate a novel current sense amplifier 500 with hysteresis for both negative and positive values of input current I1 by the inclusion of both transistors M7 and M8. By the use of fixed current values to drive either I1 and/or I2 and the addition of transistors M7 and M8 a wide variety of hysteresis conditions can be provided for signal detection. The high trip point Tph and low trip point Tpl can be set at either positive or negative current values.

Figure 6:
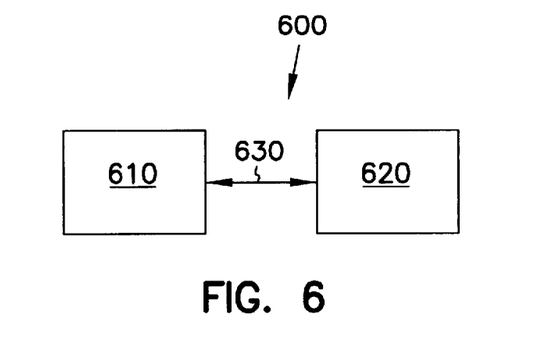
FIG. 6 is a block diagram illustrating an electronic system according to the teachings of the present invention.

FIG. 6 is a block diagram illustrating an electronic system 600 according to the teachings of the present invention. The electronic system 600 includes a processor, or processing unit 610 and a memory device 620, e.g. a random access memory (RAM). A bus 630 communicatively couples the central processing unit 610 and the memory device 620. In one embodiment, the bus 630 includes a system bus, a serial connection, or other bus. In one embodiment, the processor 610 and the memory device 620 are on a single semiconductor wafer. In an alternative embodiment, the processor 610 and the memory device 620 are on two separate semiconductor wafers. In one embodiment, the memory device 620 further includes a current sense amplifier, current comparator, or receiver circuit as described and presented in detail above in connection with FIG. 3A. In an alternative embodiment, the memory device 620 further includes a current sense amplifier, current comparator, or receiver circuit as described and presented in detail above in connection with FIG. 4A. In another alternative embodiment, the memory device 620 further includes a current sense amplifier, current comparator, or receiver circuit as described and presented in detail above in connection with FIG. 5A.

Figure 7:
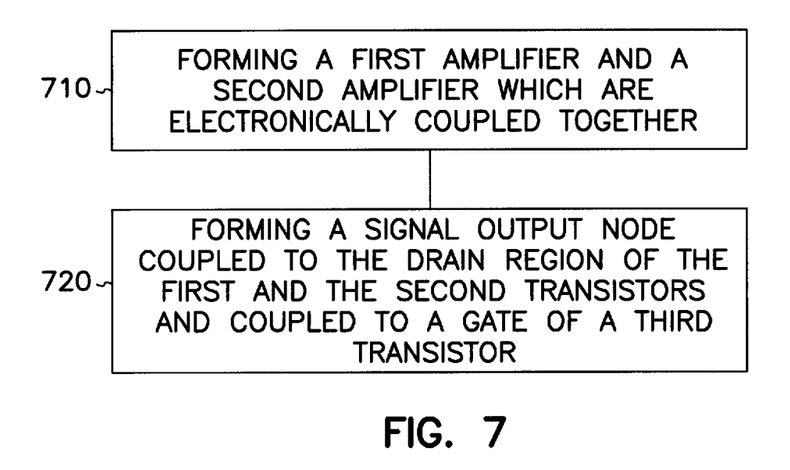
FIG. 7 illustrates, in flow diagram form, a method of forming a current sense amplifier according to the teachings of the present invention.

FIG. 7 illustrates, in flow diagram form, a method of forming a current sense amplifier according to the teachings of the present invention. The method includes forming a first amplifier and a second amplifier electrically coupled together 710. Forming each amplifier includes forming a first transistor of a first conductivity type and forming a second transistor of a second conductivity type. The first and second transistors are coupled at a drain region. Forming each amplifier includes forming a signal input coupled to a source region of the first transistor. The method further includes forming a signal output node coupled to the drain region of the first and the second transistors in the second amplifier where forming the signal output node includes coupling the signal output node to a gate of a third transistor 720. In one embodiment, forming the signal output node further includes coupling the signal output node to a gate of a fourth transistor. In one embodiment, forming a first amplifier and a second amplifier electrically coupled together includes coupling the drain region for the first and the second transistors in the first amplifier to gates of the second transistor in the first and the second amplifiers. In one embodiment, coupling the signal output node to a gate of a third transistor includes coupling the signal output node to a gate of an n-channel metal oxide semiconductor (NMOS) transistor.

Figure 8:
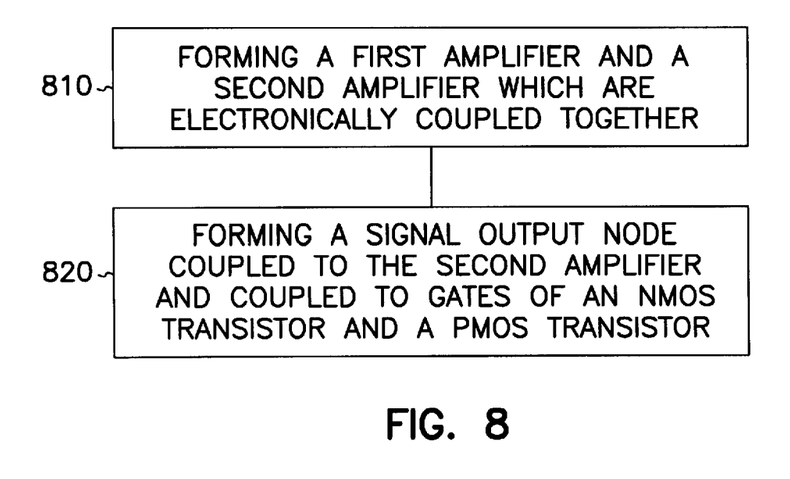
FIG. 8 illustrates, in flow diagram form, a method of forming a current comparator with hysteresis.

FIG. 8 illustrates, in flow diagram form, a method of forming a current comparator with hysteresis. The method includes forming a first amplifier and a second amplifier which are electrically coupled together 810. Forming each amplifier includes forming a first NMOS transistor and forming a first PMOS transistor where the first NMOS transistor and the first PMOS transistor are coupled at a drain region. Forming each amplifier includes forming a signal input coupled to a source region of the first NMOS transistor in each amplifier. The method further includes forming a signal output node coupled to the drain region of the first NMOS transistor and the first PMOS transistor in the second amplifier where forming the signal output node includes coupling the signal output node to gates of a second NMOS transistor and a second PMOS transistor 820. In one embodiment, forming a first amplifier and a second amplifier which are electrically coupled include coupling the drain region for the first NMOS and the first PMOS transistors in the first amplifier to gates of the first PMOS transistors in the first and the second amplifiers.

Figure 9:
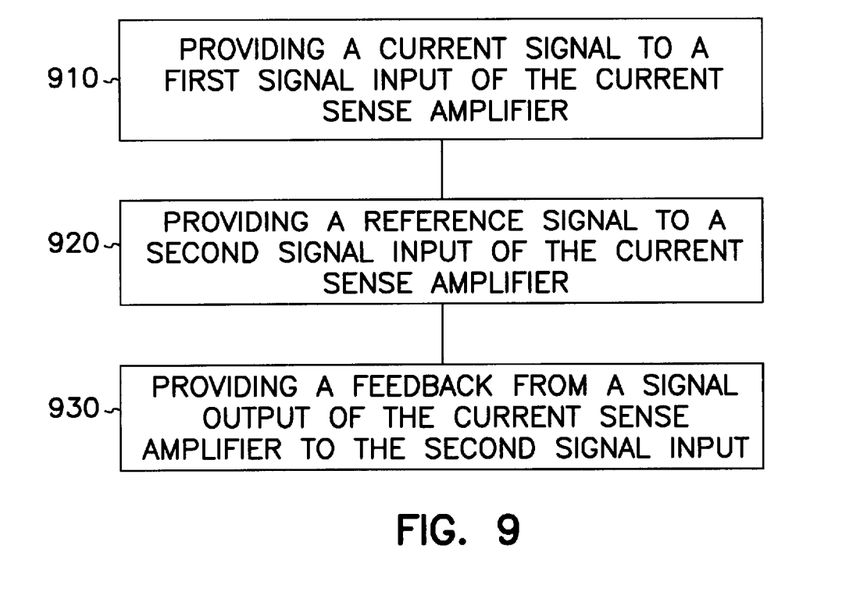
FIG. 9 illustrates, in flow diagram form, a method for operating a current sense amplifier according to the teachings of the present invention.

FIG. 9 illustrates, in flow diagram form, a method for operating a current sense amplifier according to the teachings of the present invention. The method includes providing a current signal to a first signal input of the current sense amplifier 910. The method includes providing a reference signal to a second signal input of the current sense amplifier 920. The method further includes providing a feedback from a signal output of the current sense amplifier to the second signal input such that providing a first feedback from the signal output to the second signal input introduces a hysteresis into the current sense amplifier in order to discriminate against noise transients 930. In one embodiment, the method of FIG. 9 includes providing a second feedback from the signal output to the first signal input. In one embodiment, providing a second feedback from the signal output to the first signal input includes adjusting a low threshold voltage trip point (Tpl) in the current sense amplifier. In this embodiment, providing a first feedback from the signal output to the second signal input includes adjusting a high threshold voltage trip point (Tph) in the current sense amplifier.

Figure 10:
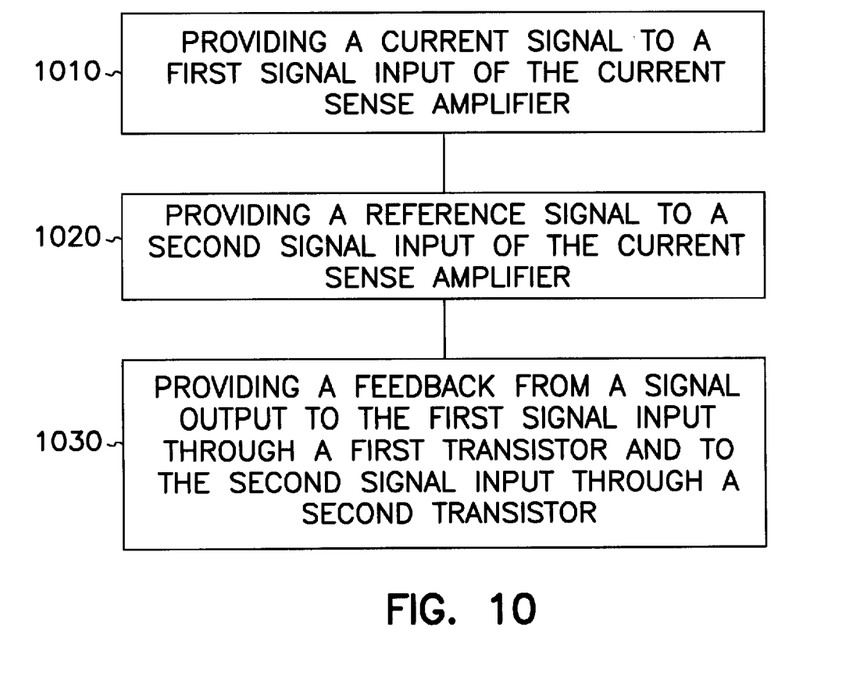
FIG. 10 illustrates, in flow diagram form, another method for operating a current sense amplifier according to the teachings of the present invention.

FIG. 10 illustrates, in flow diagram form, another method for operating a current sense amplifier according to the teachings of the present invention. The method includes providing a current signal to a first signal input of the current sense amplifier 1010. The method includes providing a reference signal to a second signal input of the current sense amplifier 1020. The method further includes providing a feedback from a signal output of the current sense amplifier to the first signal input through a first transistor and to the second signal input through a second transistor such that providing a feedback from the signal output of the current sense amplifier to the first and the second signal inputs includes adjusting voltage thresholds for the detection of valid signals along with the rejection of small noise current transients or reflections and ringing in the current sense amplifier 1030. In one embodiment, adjusting voltage thresholds for the detection of valid signals along with the rejection of small noise current transients or reflections and ringing includes adjusting a high threshold voltage trip point (Tph) in the current sense amplifier and includes adjusting a low threshold voltage trip point (Tpl) in the current sense amplifier. In one embodiment, providing a feedback from a signal output of the current sense amplifier to the first signal input through a first transistor includes adjusting a low threshold voltage trip point (Tpl) in the current sense amplifier. In this embodiment, providing a feedback from a signal output of the current sense amplifier to the second signal input through a second transistor includes adjusting a high threshold voltage trip point (Tph) in the current sense amplifier.

CONCLUSION

Thus, novel structures and methods for improving high speed signaling on and between integrated circuits has been described. The novel current sense amplifiers with hysteresis are fabricated according to a streamlined CMOS process technology. The introduction of hysteresis into the current sense amplifiers and/or receivers will allow them to discriminate against noise transients since the output will not change states unless the signal becomes more positive than a high trip point, Tph, or more negative than a low trip point, Tpl.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A current sense amplifier, comprising:
   a first amplifier and a second amplifier, wherein each amplifier comprises:
   a first transistor of a first conductivity type;
   a second transistor of a second conductivity type, wherein the first and second transistors are coupled at a drain region; and
   a signal input node coupled to a source region of the first transistor; and
   a signal output node coupled to the drain region of the first and the second transistors in the second amplifier, and wherein the signal output node is further coupled to a gate of a third transistor wherein a source region of the third transistor is coupled directly to a source region of the second transistor in the first amplifier and a drain region of the third transistor is coupled to the signal input node in at least one of the first and the second amplifiers.

2. The current sense amplifier of claim 1, wherein the first transistor of a first conductivity type includes an n-channel metal oxide semiconductor (NMOS) transistor, and wherein the second transistor of a second conductivity type includes a p-channel metal oxide semiconductor (PMOS) transistor.

3. The current sense amplifier of claim 1, wherein the drain region for the first and the second transistors in the first amplifier are coupled to gates of the second transistors in the first and the second amplifiers.

4. The current sense amplifier of claim 1, wherein the third transistor is a p-channel metal oxide semiconductor (PMOS) transistor.

5. The current sense amplifier of claim 1, wherein the signal input node of the first amplifier receives an input current, and wherein the signal input node of the second amplifier receives a reference current.

6. A current comparator, comprising:
   a first amplifier and a second amplifier, wherein each amplifier comprises:
   a first n-channel metal oxide semiconductor (NMOS) transistor;
   a p-channel metal oxide semiconductor (PMOS) transistor, wherein the NMOS and the PMOS transistors are coupled at a drain region; and
   a signal input node coupled to a source region of the NMOS transistor; and
   a signal output node coupled to the drain region of the NMOS and the PMOS transistors in the second amplifier, and wherein the signal output node is further coupled to a gate of a second NMOS transistor, a drain region of the second NMOS transistor is coupled to a source region of the PMOS transistor in the second amplifier, and a source region of the second NMOS transistor is coupled to the signal input node in the second amplifier.

7. The current comparator of claim 6, wherein the drain region for the first NMOS transistor and the PMOS transistor in the first amplifier are coupled to a gate of the p-channel metal oxide semiconductor (PMOS) transistors in the first and the second amplifiers.

8. The current comparator of claim 6, wherein the signal input node of the first amplifier receives an input current, and wherein the signal input node of the second amplifier receives a reference current.

9. A current sense amplifier, comprising:
   a first amplifier and a second amplifier, wherein each amplifier comprises:
   a first transistor of a first conductivity type;

a second transistor of a second conductivity type, wherein the first and second transistors are coupled at a drain region; and a signal input node coupled to a source region of the first transistor; and a signal output node coupled to the drain region of the first and the second transistors in the second amplifier, and wherein the signal output node is further coupled to a gate of a third transistor and a fourth transistor, and wherein a drain region of the third transistor is coupled to the signal input node in at least one of the first and the second amplifiers.

10. The current sense amplifier of claim 9, wherein a source region of the third transistor is coupled to a source region of the second transistor in the first amplifier, and wherein the drain region of the third transistor is coupled to the signal input node in the first amplifier.

11. The current sense amplifier of claim 10, wherein a drain region of the fourth transistor is coupled to a source region of the second transistor in the first amplifier, and wherein a source region of the fourth transistor is coupled to the signal input node in the second amplifier.

12. The current sense amplifier of claim 9, wherein the first transistor of a first conductivity type and the fourth transistor include an n-channel metal oxide semiconductor (NMOS) transistor, and wherein the second transistor of a second conductivity type and the third transistor include a p-channel metal oxide semiconductor (PMOS) transistor.

13. The current sense amplifier of claim 9, wherein the drain region for the first and the second transistors in the first amplifier are coupled to gates of the second transistors in the first and the second amplifiers.

14. The current sense amplifier of claim 13, wherein the signal input node of the first amplifier receives an input current, and wherein the signal input node of the second amplifier receives a reference current.

15. An electronic system, comprising:
a processor;
a memory device; and
a bus coupling the processor and the memory device, the memory device including a current sense amplifier, comprising:
a first amplifier and a second amplifier, wherein each amplifier comprises:
a first transistor of a first conductivity type;
a second transistor of a second conductivity type, wherein the first and second transistors are coupled at a drain region; and
a signal input node coupled to a source region of the first transistor; and
a signal output node coupled to the drain region of the first and the second transistors in the second amplifier, and wherein the signal output node is further coupled to a gate of a third transistor, wherein a source region of the third transistor is coupled directly to a source region of the second transistor in the first amplifier, and wherein a drain region of the third transistor is coupled to the signal input node in at least one of the first and the second amplifiers.

16. The electronic system of claim 15, wherein the drain region of the third transistor is coupled to the signal input node in the first amplifier.

17. The electronic system of claim 15, wherein the signal output node is further coupled to a gate of a fourth transistor.

18. The electronic system of claim 17, wherein a drain region of the fourth transistor is coupled to a source region of the second transistor in the second amplifier, and wherein a source region of the fourth transistor is coupled to the signal input node in the second amplifier.

19. The electronic system of claim 17, wherein the first transistor of a first conductivity type and the fourth transistor include an n-channel metal oxide semiconductor (NMOS) transistor, and wherein the second transistor of a second conductivity type and the third transistor include a p-channel metal oxide semiconductor (PMOS) transistor.

20. The electronic system of claim 15, wherein the drain region for the first and the second transistors in the first amplifier are coupled to gates of the second transistors in the first and the second amplifiers.

21. The electronic system of claim 15, wherein the signal input node of the first amplifier receives an input current, and wherein the signal input node of the second amplifier receives a reference current.

22. An integrated circuit, comprising:
a processor;
a memory operatively coupled to the processor; and
wherein the processor and memory are formed on the same semiconductor substrate and the integrated circuit includes at least one current sense amplifier coupled to the memory, comprising:
a first amplifier and a second amplifier, wherein each amplifier comprises:
a first transistor of a first conductivity type;
a second transistor of a second conductivity type, wherein the first and second transistors are coupled at a drain region; and
a signal input node coupled to a source region of the first transistor; and
a signal output node coupled to the drain region of the first and the second transistors in the second amplifier, and wherein the signal output node is further coupled to a gate of a third transistor, wherein a source region of the third transistor is coupled directly to a source region of the second transistor in the first amplifier, and wherein a drain region of the third transistor is coupled to the signal input node in at least one of the first and the second amplifiers.

23. The integrated circuit of claim 22, wherein the signal output node is further coupled to a gate of a fourth transistor.

24. The integrated circuit of claim 22, wherein the drain region of the third transistor is coupled to the signal input node in the first amplifier.

25. The integrated circuit of claim 23, wherein the first transistor of a first conductivity type and the fourth transistor includes an n-channel metal oxide semiconductor (NMOS) transistor, and wherein the second transistor of a second conductivity type includes a p-channel metal oxide semiconductor (PMOS) transistor.

26. The integrated circuit of claim 22, wherein the drain region for the first and the second transistors in the first amplifier are coupled to gates of the second transistors in the first and the second amplifiers.

27. The integrated circuit of claim 22, wherein the signal input node of the first amplifier receives an input current, and wherein the signal input node of the second amplifier receives a reference current.

28. A method of forming a current sense amplifier, comprising:
forming a first amplifier and a second amplifier, wherein the forming of each amplifier comprises:
forming a first transistor of a first conductivity type;
forming a second transistor of a second conductivity type, wherein the first and second transistors are coupled at a drain region; and forming a signal input node coupled to a source region of the first transistor; and forming a signal output node coupled to the drain region of the first and the second transistors in the second amplifier, and wherein the forming of the signal output node includes coupling the signal output node to a gate of a third transistor, coupling a source region of the third transistor directly to a source region of the second transistor in the first amplifier, and coupling a drain region of the third transistor to the signal input node in at least one of the first and the second amplifiers.

29. The method of claim 28, wherein the forming of the signal output node further includes coupling the signal output node to a gate of a fourth transistor.

30. The method of claim 28, wherein the coupling of the drain region of the third transistor to the signal input node in at least one of the first and the second amplifiers includes coupling the drain region of the third transistor to the signal input node in the first amplifier.

31. The method of claim 28, wherein the forming of the first transistor of a first conductivity type includes forming an n-channel metal oxide semiconductor (NMOS) transistor, and wherein forming the second transistor of a second conductivity type includes forming a p-channel metal oxide semiconductor (PMOS) transistor.

32. The method of claim 28, wherein the forming of the first amplifier and the second amplifier includes coupling the drain region for the first and the second transistors in the first amplifier to gates of the second transistor in the first and the second amplifiers.

33. The method of claim 28, wherein the coupling of the signal output node to a gate of a third transistor includes the third transistor which is a p-channel metal oxide semiconductor (PMOS) transistor.

34. The method of claim 28, wherein the forming of the signal input node of the first amplifier includes coupling the signal input node to an input current, and wherein the forming of the signal input node of the second amplifier includes coupling the signal input node to a reference current.

35. A method of forming a current comparator with hysteresis, comprising:

forming a first amplifier and a second amplifier, wherein forming each amplifier comprises:
    forming a first NMOS transistor;
    forming a first PMOS transistor, wherein the first NMOS transistor and the first PMOS transistor are coupled at a drain region; and
    forming a signal input node coupled to a source region of the first NMOS transistor; and
    forming a signal output node coupled to the drain region of the first NMOS transistor and the first PMOS transistor in the second amplifier, and wherein the forming of the signal output node includes coupling the signal output node to gates of a second NMOS transistor and a second PMOS transistor, and wherein a source region of the second NMOS transistor is coupled to the signal input node in at least one of the first and the second amplifiers.

36. The method of claim 35, wherein the forming of the first amplifier and the second amplifier includes coupling the drain region for the first NMOS and the first PMOS transistors in the first amplifier to gates of the first PMOS transistors in the first and the second amplifiers.

37. The method of claim 35, wherein the forming of the signal input node of the first amplifier includes coupling the signal input node to an input current, and wherein the forming of the signal input node of the second amplifier includes coupling the signal input node to a reference current.

38. A method for operating a current sense amplifier, comprising:

providing a current signal to a first signal input node of the current sense amplifier;

providing a reference signal to a second signal input node of the current sense amplifier;

providing a first feedback from a signal output of the current sense amplifier to the second signal input node; and wherein the providing of a first feedback from the signal output to the second signal input node introduces a hysteresis into the current sense amplifier in order to discriminate against noise transients and wherein the providing of a first feedback from the signal output to the second signal input node includes adjusting a high threshold voltage trip point (Tph) in the current sense amplifier.

39. The method of claim 38, wherein the method further includes providing a second feedback from the signal output to the first signal input node.

40. The method of claim 39, wherein the providing of a second feedback from the signal output to the first signal input node includes adjusting a low threshold voltage trip point (Tpl) in the current sense amplifier.

41. A method for operating a current sense amplifier, comprising:

providing a current signal to a first signal input node of the current sense amplifier;

providing a reference signal to a second signal input node of the current sense amplifier;

providing a feedback from a signal output of the current sense amplifier to the first signal input node through a first transistor and to the second signal input node through a second transistor; and wherein the providing of a feedback from the signal output of the current sense amplifier to the first and the second signal input nodes includes adjusting voltage thresholds for the detection of valid signals along with the rejection of small noise current transients or reflections and ringing.

42. The method of claim 41, wherein the adjusting of voltage thresholds for the detection of valid signals along with the rejection of small noise current transients or reflections and ringing includes adjusting a high threshold voltage trip point (Tph) in the current sense amplifier and includes adjusting a low threshold voltage trip point (Tpl) in the current sense amplifier.

43. The method of claim 41, wherein the providing of a feedback from a signal output of the current sense amplifier to the first signal input node through a first transistor includes adjusting a low threshold voltage trip point (Tpl) in the current sense amplifier.

44. The method of claim 41, wherein the providing of a feedback from a signal output of the current sense amplifier to the second signal input node through a second transistor includes adjusting a high threshold voltage trip point (Tph) in the current sense amplifier.

* * * * *

UNITED STATES PATENT AND TRADEMARK OFFICE
CERTIFICATE OF CORRECTION

PATENT NO. : 6,307,405 B2  
DATED : October 23, 2001  
INVENTOR(S) : Leonard Forbes and Eugene H. Cloud It is certified that error appears in the above-identified patent and that said Letters Patent is hereby corrected as shown below:

<u>Title page,</u>  
Item [57], in the ABSTRACT,  
Line 2, insert -- , -- between "area" and "yet".

<u>Column 1,</u>  
Line 16, insert -- , -- after "hysteresis".  
Line 18, insert -- , -- after "recognized".  
Line 21, insert -- , -- after "recognized".  
Line 24, insert -- , -- after "signaling".  
Line 44, insert -- , -- after "lines".  
Line 50, insert -- , -- after "ringing".

<u>Column 3,</u>  
Line 67, delete "Mr." and insert -- M1 --, therefor.

<u>Column 4,</u>  
Line 27, insert -- , -- after "FIG. 3A".

Signed and Sealed this

Fourth Day of June, 2002

*Attest:*

JAMES E. ROGAN  
*Director of the United States Patent and Trademark Office*

*Attesting Officer*